United States Patent [19]

Geffken et al.

[11] Patent Number: 5,488,013
[45] Date of Patent: Jan. 30, 1996

[54] METHOD OF FORMING TRANSVERSE DIFFUSION BARRIER INTERCONNECT STRUCTURE

[75] Inventors: Robert M. Geffken, Burlington; Matthew J. Rutten, Milton, both of Vt.

[73] Assignee: International Business Machines Corporation, Armonk, N.Y.

[21] Appl. No.: 428,995

[22] Filed: Apr. 26, 1995

Related U.S. Application Data

[62] Division of Ser. No. 169,787, Dec. 20, 1993.

[51] Int. Cl.⁶ .................................................. H01L 21/28
[52] U.S. Cl. ........................... 437/187; 437/190; 437/195
[58] Field of Search .................................. 437/944, 187, 437/190, 192, 195, 50

[56] References Cited

U.S. PATENT DOCUMENTS

| | | | |
|---|---|---|---|
| 4,808,552 | 2/1989 | Anderson | 437/187 |
| 4,931,137 | 6/1990 | Sibuet | 437/944 |
| 5,169,802 | 12/1992 | Yeh | 437/195 |

OTHER PUBLICATIONS

W. Buthrie et al, IBM Tech. Discl. Bull., 32 (10B), pp. 114–115 1990.

*Primary Examiner*—George Fourson
*Assistant Examiner*—Thomas G. Bilodeau
*Attorney, Agent, or Firm*—Heslin & Rothenberg

[57] ABSTRACT

An interconnect line is formed of a metallization layer and a plurality of transverse diffusion barriers spaced within said metallization layer. The transverse diffusion barriers separate the length of metallization of the line into discrete sections, such that each section is only 20–50 microns in length. The diffusion barriers reduce electromigration and metal creep within the metal line, each of which can cause failure of the line. The method further provides such an interconnect line formed within an insulator layer, for use in multi-level interconnect structures.

5 Claims, 7 Drawing Sheets

METHOD OF FORMING TRANSVERSE DIFFUSION BARRIER INTERCONNECT STRUCTURE

This application is a division of application Ser. No. 08/169,787, filed Dec. 20, 1993.

TECHNICAL FIELD

This invention relates to interconnect lines for a semiconductor structure, and more particularly to an interconnect line formed with isolated, periodic transverse spaced-apart diffusion barriers within the line to alleviate electromigration and metal creep within the line.

BACKGROUND ART

Multi-layer interconnect lines are commonly used in the semiconductor industry. Metallization lines are connected via studs, commonly made of tungsten (W). The lines themselves are often made of aluminum (Al) and/or copper (Cu). Two problems that are commonly encountered with such multi-layer interconnect line structures are electromigration and metal creep. Both of these phenomenon involve the transport of metal atoms along the direction of electron flow in the lines, and can lead to failure of the lines.

Al-Cu electromigration in a structure with Al-Cu lines and W studs is now well established. The phenomenon occurs because Cu diffusivity through W is much lower than through Al. Therefore the Cu is depleted from the area of the W stud by the current flow and not replaced, leading to failure at the W to Al-Cu stud interface.

Metal creep, on the other hand, occurs due to the differences in the thermal coefficients of expansion between metals, insulators, and silicon wafers. The differences in thermal coefficients of expansion can build up stress in the metal lines, which can lead to migration of atoms in the line to the various areas of high stress and strain. This migration of atoms forms voids or vacancies in the metal line which can cause creep failure.

Another phenomenon that is frequently observed is that short lines, i.e. less than about 50 microns, do not fail due to electromigration. The explanation for this is that the flow of Cu and Al out of the stud region is counterbalanced by other forces (either stress or concentration gradients) which cause a migration of material in the opposite direction. A steady state with no net material transport is achieved and there is no stud interconnect failure by electromigration. Current technologies for providing such short lines involve running along a line on one level for 50 microns, then dropping through a stud to another level to run 50 microns, and then moving back up through a stud to another level, etc. This is not a very practical solution to electromigration problems, however, due to the amount of space taken up by the multi-level interconnect line structure.

An attempt to overcome electromigration problems is shown in Cronin, J. E., et al., "Elimination of CMOS Electromigration-Induced Extrusions", IBM Tech. Discl. Bull. Vol. 31, No. 6 (November 1988), pp. 461–462. Cronin et al. show a wiring structure in which tungsten links are interposed in multi-level aluminum-copper lines to increase electromigration resistance. However, the links are not in the same plane as the metal lines, thus not providing a practical solution to electromigration due to the space required. Furthermore, the links are spaced 300 microns apart which does not optimize electromigration reduction.

Attempts have also been made to overcome electromigration problems by providing longitudinal barrier layers in lines. Cook, H. C., et al., "Process and Structure for Improved Electromigration Resistance", IBM Tech. Discl. Bull. Vol. 31, No. 10B (March 1990), pp. 112–113, disclose an aluminum-copper line formed in a titanium-tungsten trough to provide a low resistivity line with improved electromigration resistance. Tungsten stud interconnections are provided above and below the lines. In this arrangement, the refractory metals serve as longitudinal shunts that can still carry electric current even after substantial aluminum migration.

Another reference disclosing the formation of longitudinal diffusion barriers in aluminum lines is Howard, J. K., et al., "Fabrication of Intermetallic Diffusion Barriers for Electromigration in Narrow-Line Stripes", IBM Tech. Discl. Bull. Vol. 20, No. 9 (February 1978), pp. 3477–3479. Howard et al. disclose the formation of regions of intermetallic compounds of aluminum/transition metal to increase electromigration resistance in aluminum lines.

Additional solutions to the problem of electromigration in lines are always desirable, which can control electromigration and metal creep problems while minimizing the space utilized by the line structure.

DISCLOSURE OF INVENTION

This need is met, and some of the problems of prior interconnect lines overcome, by the structure and method of the subject invention. The main components of the interconnect line according to the subject invention are a metallization layer forming the line and a plurality of transverse diffusion barriers spaced within (i.e. within the same plane as) the metallization layer. The transverse diffusion barriers are capable of withstanding stress caused by electromigration of atoms within the metallization layer. These diffusion barriers also separate the length of metallization forming the line into discrete sections, such that each section is only 20–50 microns in length. The diffusion barriers reduce electromigration and metal creep within the metal line, each of which can cause failure of the line.

Further in accordance with the subject invention, a metallization structure is provided which includes the above-described metallization line within an insulator layer. More particularly, a trench is formed in an insulator layer. The trench extends to two different depths. The first and shallowest depth provides for the location of the interconnect line. The second and deeper depth provides a location for a stud to connect the interconnect line to a layer underlying the insulator layer. This second depth therefore extends through the insulator layer. A metallization layer with a plurality of transverse diffusion barriers spaced therein is provided within the trench.

In use, the interconnect line and metallization structure are used in multi-level applications. Thus, the stud from one interconnect line extends through the underlying insulator layer to the interconnect line lying below the insulator layer. Successive levels of interconnect lines are thus formed in insulator layers so connected. Each interconnect line has the plurality of transverse diffusion barriers spaced within the metallization of the line.

The metallization of the interconnect line often comprises aluminum and/or copper. The diffusion barrier material for such a metallization often comprises tungsten, since tungsten is an example of a diffusion barrier material capable of withstanding stress within the line. It is possible to vary the formation of the interconnect line so that the metallization extends through the insulator layer to the underlying layer (i.e. through the trench at its second depth), or this portion of the trench can be filled with a stud material such as tungsten. This is more fully described below.

The interconnect line is formed by first forming an insulator layer. In use, the insulator layer often overlies a semiconductor structure, such as the contacts of the structure. A trench is then formed in the insulator layer, with a first depth within the insulator layer for the interconnect line location and a second depth through the insulator layer. The interconnect line will be connected to the contacts through the second depth of the trench in the insulator layer.

After the trench is formed, a pattern of sections of material is formed within the trench. The pattern provides material transversely across the trench (i.e. perpendicular to the flow of atoms within the interconnect line that will be formed within the trench) in spaced apart relation to one another. Preferably, the sections of pattern material are spaced apart by 20–50 microns to maximize reduction in electromigration and metal creep. This pattern can be formed using conventional resist material, or other suitable materials such as polymers (i.e. polyimide) which can similarly function as a mask.

A diffusion barrier material is then formed over the pattern of material and within the trench. The diffusion barrier material will form the isolated, periodic transverse diffusion barriers within the interconnect line after suitable etching. Specifically, the pattern is laid out such that etching can be utilized to form isolated periodic transverse diffusion barriers, of about 0.4 to 0.8 microns in width, separated by about 20–50 microns of metallization of the interconnect line.

For example, in one embodiment a pattern of resist is laid out such that each section of the resist extends for about 20–50 microns, and is separated from the next section of resist by about a 0.4 to 0.8 micron space. The diffusion barrier material is deposited, such as by chemical vapor deposition, so that it fills the space between the sections of resist, and then the diffusion barrier material is removed except from between the sections of resist. After the resist is removed, isolated periodic diffusion barriers (about 0.4 to 0.8 microns in width) remain separated from one another by 20–50 microns. To complete the interconnect line, the metallization of the line is deposited into the trench, filling the area between the isolated barriers. The line is then planarized, leveling the metallization and the barriers, using suitable means such as chemical mechanical polishing.

In a further embodiment, the pattern of resist can be laid out with 20–50 micron sections of resist being separated from one another by 20–50 microns. The diffusion barrier material is deposited, and anisotropic etching is utilized to leave sidewall spacers of the barrier material at the sidewall of each resist section. In this manner, the 0.4 to 0.8 micron thick sidewall spacers are formed, separated by about 20–50 microns after removal of the resist.

It is also possible to simultaneously form studs to connect the interconnect line to underlying lines by leaving the deepest trench depth uncovered by the pattern of resist material. Therefore, the diffusion barrier material (i.e. tungsten, etc.) fills the trench at this depth. Etching is performed to leave this portion of the diffusion barrier material so it remains as a stud connection of the interconnect line to the underlying metallization line.

BRIEF DESCRIPTION OF DRAWINGS

The foregoing and other objects, features and advantages of the invention will be apparent from the following more particular description of preferred embodiments of the invention as illustrated in the accompanying drawings in which.

BEST MODE FOR CARRYING OUT THE INVENTION

Figure 1:
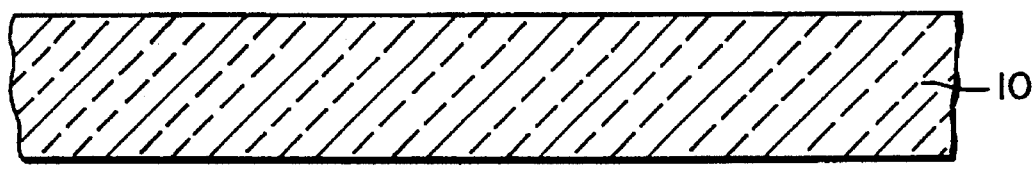
FIG. 1 is a cross-sectional elevational view of an insulator as used in one embodiment of the subject invention.

One embodiment of the subject invention is depicted in FIGS. 1–8. As shown in FIG. 1, an insulator layer 10 is provided. This insulator layer 10 would overlie a semiconductor structure and will serve as the location for an interconnect line. Typically, multiple levels of interconnect lines are provided, one upon the next. The metal of an upper interconnect line is connected to a lower interconnect line through a via which extends through the insulator layer to the underlying metal of the lower interconnect line. The upper interconnect line is separated from the lower interconnect line by the insulator.

Figure 2:
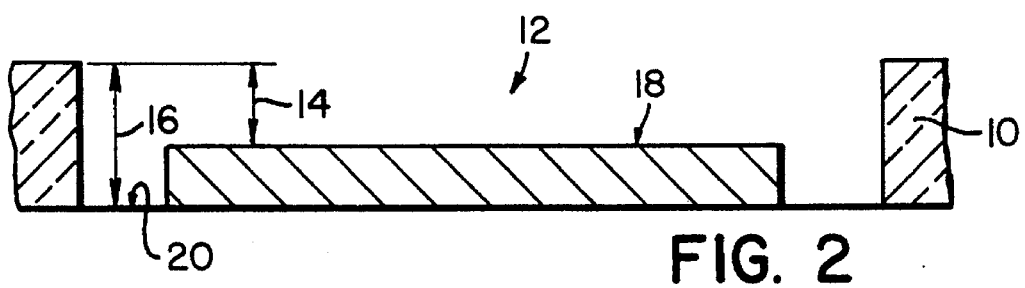
FIG. 2 is a cross-sectional elevational view of the insulator shown in FIG. 1 with a trench etched therein.

In accordance with this construction, a trench 12 is etched into the insulator layer 10 as shown in FIG. 2. The trench 12 is etched to two different levels, so that the interconnect line can be formed on the trench bottom 18 at the first depth 14 and the via 20 will provide the contact to an underlying layer at the second depth 16. This is standard construction of a trench for multi-level interconnects.

Figure 3:
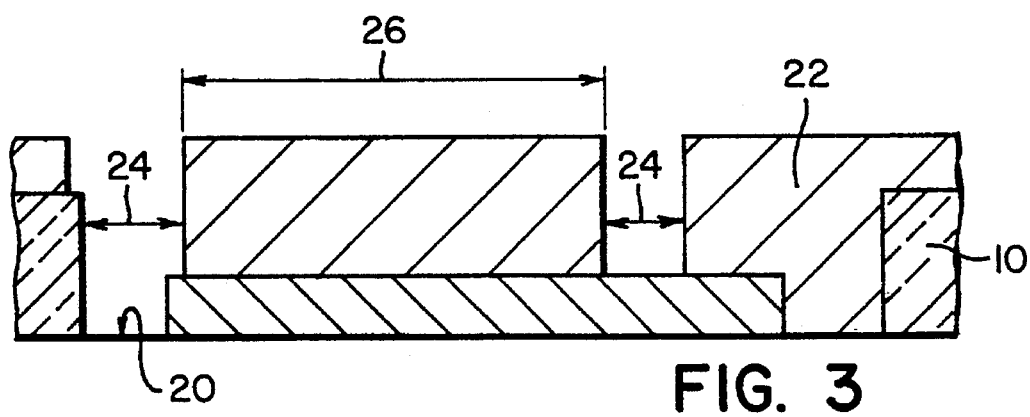
FIG. 3 is a cross-sectional elevational view of the structure shown in FIG. 2 with a pattern of resist thereon.

A pattern of resist 22 (an organic polymer, e.g. polyimide or photoresist) is then deposited on the insulator layer 10 and within the trench, as shown in FIG. 3. Each section of the resist extends a distance 26 of about 20–50 microns. A space 24 of about 0.4–0.8 microns is left between each section of resist. These 0.4–0.8 micron spaces 24 will later constitute 0.4–0.8 micron diffusion barriers formed as follows. Note that these spaces may be formed over the via structures 20 as shown in FIG. 3.

Figure 4:
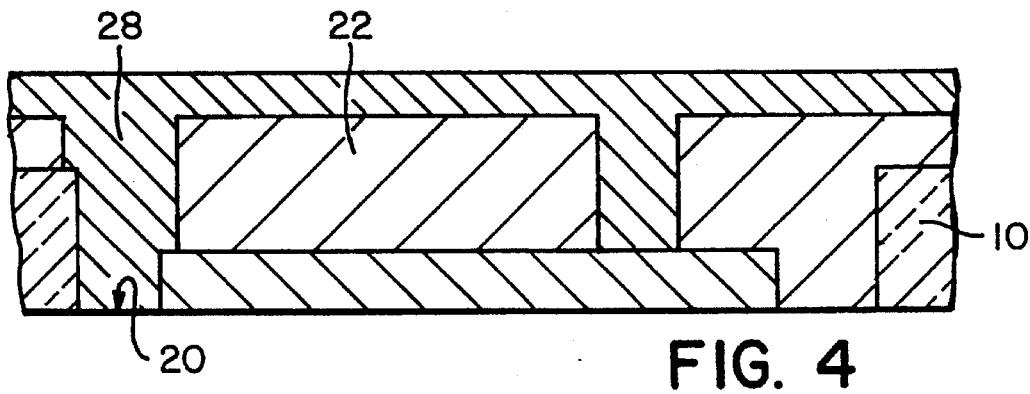
FIG. 4 is a cross-sectional elevational view of the structure shown in FIG. 3 with a diffusion barrier material deposited thereover.
Figure 5:
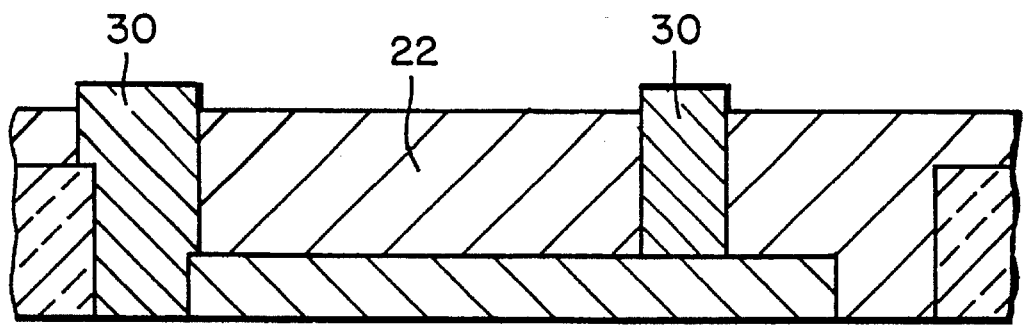
FIG. 5 is a cross-sectional elevational view of the structure shown in FIG. 4 after etching to remove a portion of the diffusion barrier material.
Figure 6:
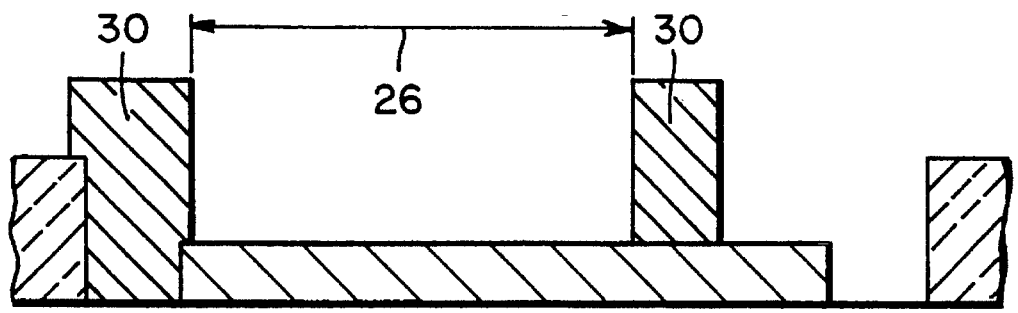
FIG. 6 is a cross-sectional elevational view of the structure shown in FIG. 5 after removal of the resist.

A diffusion barrier layer 28 is deposited over the entire structure, such that the diffusion barrier material extends to within the spaces 24 and overlies the pattern of resist (see FIG. 4). The diffusion barrier can be used to contact the underlying layer by deposition in the via 20 region. A suitable etch is then utilized to remove the diffusion barrier layer 28 overlying the resist, while leaving the diffusion barrier material in the spaces 24, to form periodic diffusion barriers 30 between the sections of resist (see FIG. 5). The resist 22 is then removed by suitable means to leave the isolated, periodic transverse diffusion barriers 30 within the trench in the insulator layer (see FIG. 6). The distance 26 between the isolated diffusion barriers is thus about 20–50 microns.

Figure 7:
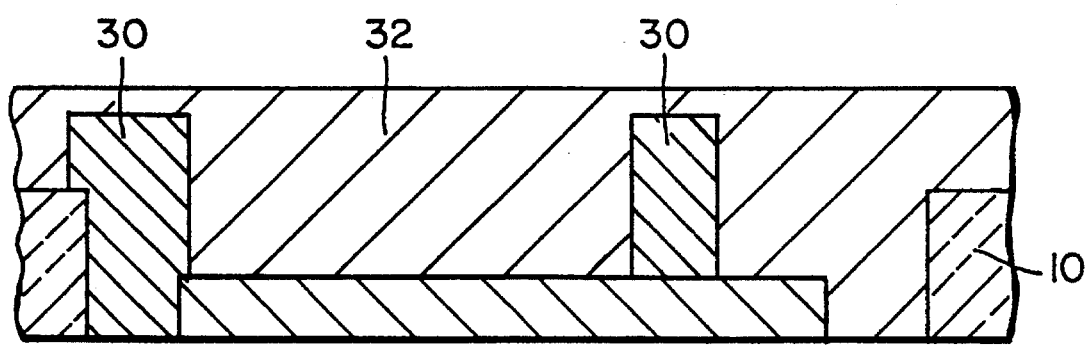
FIG. 7 is a cross-sectional elevational view of the structure shown in FIG. 6 with a layer of interconnect line metal deposited thereover.
Figure 8:
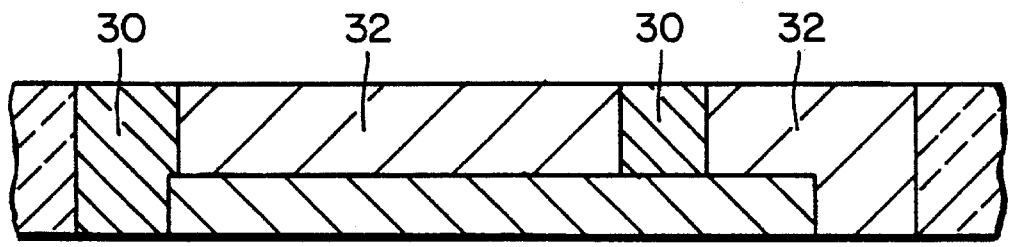
FIG. 8 is a cross-sectional elevational view of the structure shown in FIG. 7 after polishing to form the interconnect line with isolated, periodic spaced diffusion barriers therein and simultaneously formed studs.

Referring to FIG. 7, the metallization layer 32 is then deposited over the entire structure, covering the diffusion barriers 30 and filling the remainder of the trench. Suitable planarization techniques, such as chemical mechanical polishing, are then utilized to planarize the surface of the interconnect line and the diffusion barriers with the surface of the insulator layer, as shown in FIG. 8. The resulting interconnect line comprises the metallization layer 32 with isolated, periodic transverse diffusion barriers 30 within the same plane as the metallization layer 32. The interconnect line may also include vias filled with diffusion barrier material extending to underlying metallization layers, when the pattern of resist leaves the vias open for filling by the diffusion barrier material. Each section of metallization extends for about 20–50 microns, and is separated from the next adjacent section by the diffusion barrier which extends for about 0.4–0.8 microns. This structure of the interconnect line provides for reduced electromigration and metal creep. Electromigration is reduced by the counterbalancing of the stress and concentration gradients due to the shortened length of metallization material. Metal creep is reduced by shortening the length of metallization material, which limits the migration of atoms to any one area in the line which can lead to formation of voids or vacancies.

The resulting structure comprises an interconnect line into which transverse diffusion barriers are constructed. The interconnect line is thereby segmented into compartments in which mass is essentially conserved. The barriers are placed at such a frequency that Al and Cu pileup due to the flow of current are balanced by material transport due to stress and concentration gradients. A steady state is thus established and electromigration is inhibited.

Figure 9:
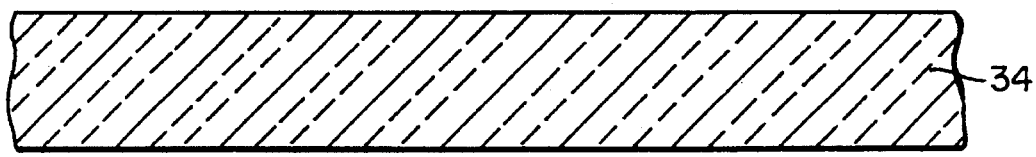
FIG. 9 is a cross-sectional elevational view of an insulator as used in another embodiment of the subject invention.

A further embodiment of the subject invention is depicted in FIGS. 9–16. As shown in FIG. 9, an insulator layer 34 is provided. As with the first embodiment, this insulator layer 34 would overlie a semiconductor structure and will serve as the location for an interconnect line.

Figure 10:
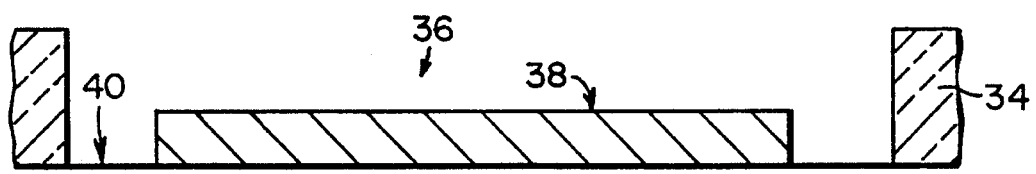
FIG. 10 is a cross-sectional elevational view of the insulator shown in FIG. 9 with a trench etched therein.

In accordance with this construction, a trench 36 is etched into the insulator layer 34 as shown in FIG. 10. The trench 36 is etched to two different levels, so that the interconnect line can be formed on the trench bottom 38 at the first depth and the via 40 will provide the contact to an underlying layer at the second depth.

Figure 11:
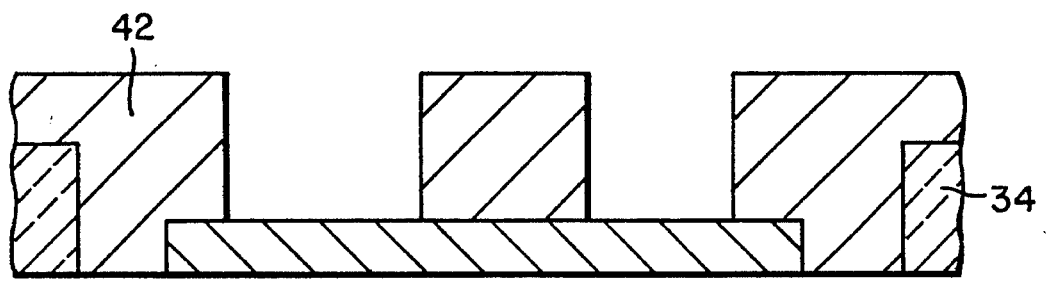
FIG. 11 is a cross-sectional elevational view of the structure shown in FIG. 10 with a pattern of resist thereon.

In accordance with the subject invention, a pattern of resist 42 is deposited on the insulator layer 34 and within the trench, as shown in FIG. 11. In this embodiment, each section of the resist extends a distance of about 20–50 microns, but the space between sections is also about 20–50 microns.

Figure 12:
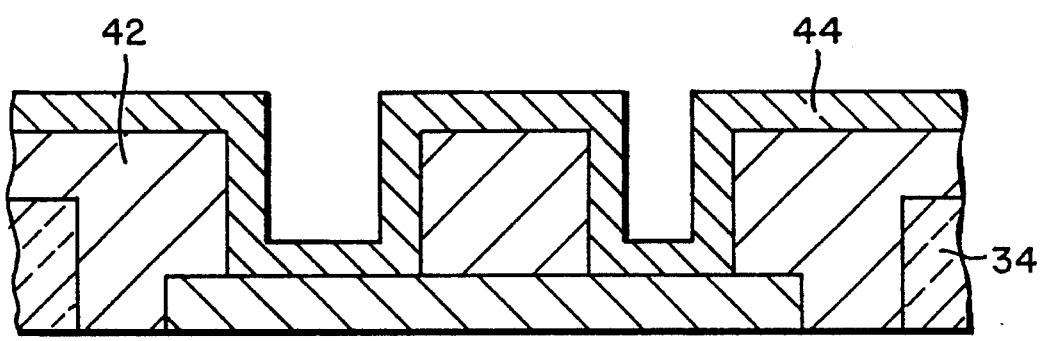
FIG. 12 is a cross-sectional elevational view of the structure shown in FIG. 11 with a diffusion barrier material deposited thereover.
Figure 13:
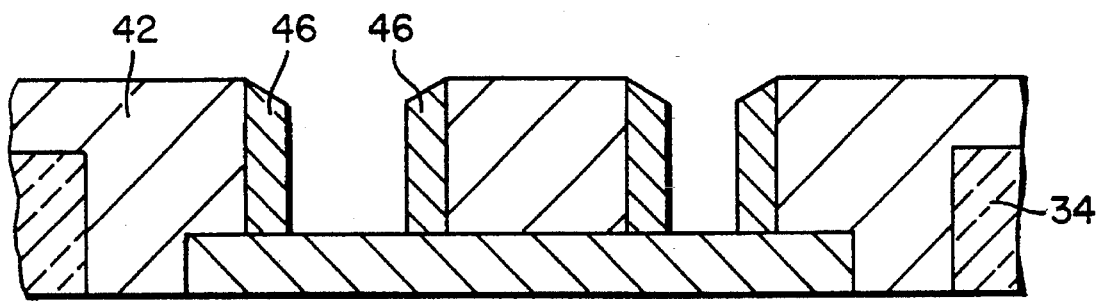
FIG. 13 is a cross-sectional elevational view of the structure shown in FIG. 12 after etching to remove a portion of the diffusion barrier material.
Figure 14:
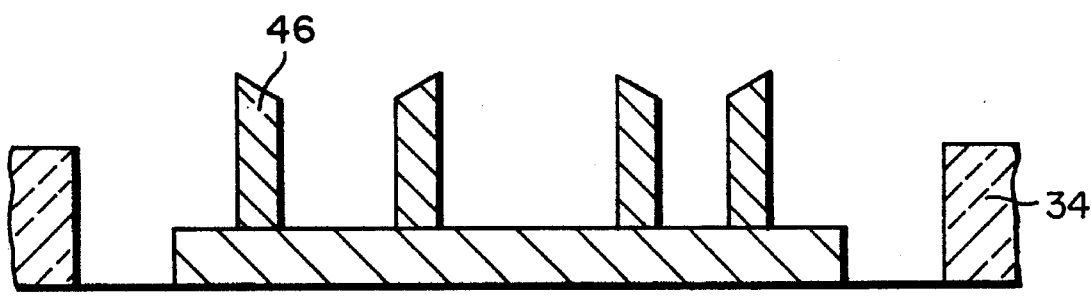
FIG. 14 is a cross-sectional elevational view of the structure shown in FIG. 13 after removal of the resist.

A diffusion barrier layer 44 is deposited over the entire structure, such that the diffusion barrier material conformally covers the entire structure (see FIG. 12). A suitable anisotropic etch is then utilized to remove the diffusion barrier layer 44 from the horizontal surfaces, while leaving the vertical sidewall spacers of diffusion barrier material. These sidewall spacers will form the isolated, periodic transverse diffusion barriers 46 within the interconnect line (see FIG. 13). The resist 42 is then removed by suitable means to leave the isolated, periodic transverse diffusion barriers 46 within the trench in the insulator layer (see FIG. 14). The distance between the diffusion barriers is thus about 20–50 microns.

Figure 15:
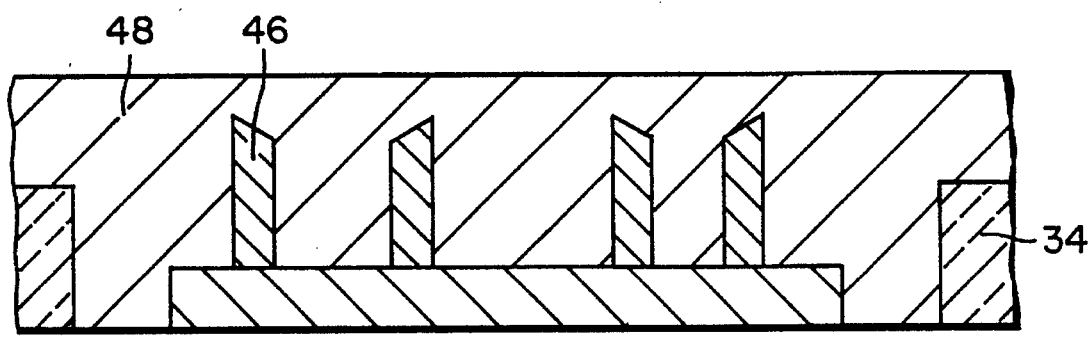
FIG. 15 is a cross-sectional elevational view of the structure shown in FIG. 14 with a layer of interconnect line metal deposited thereover.
Figure 16:
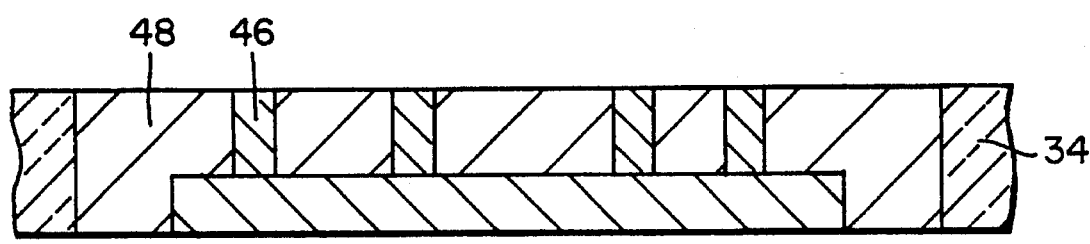
FIG. 16 is a cross-sectional elevational view of the structure shown in FIG. 15 after polishing to form the interconnect line with isolated, periodic spaced diffusion barriers therein.

Referring to FIG. 15, the metallization layer 48 is then deposited over the entire structure, covering the diffusion barriers 46 and filling the remainder of the trench. Suitable planarization techniques, such as chemical mechanical polishing, are then utilized to planarize the surface of the interconnect line and the diffusion barriers with the surface of the insulator layer, as shown in FIG. 16. The resulting interconnect line comprises the metallization layer 48 with isolated, periodic transverse diffusion barriers 46 within the same plane as the metallization layer 48. Each section of metallization extends for about 20–50 microns, and is separated from the next adjacent section by the diffusion barrier which extends for about 0.4–0.8 microns. This structure of the interconnect line, as with the above embodiment, provides for reduced electromigration and metal creep.

Figure 17:
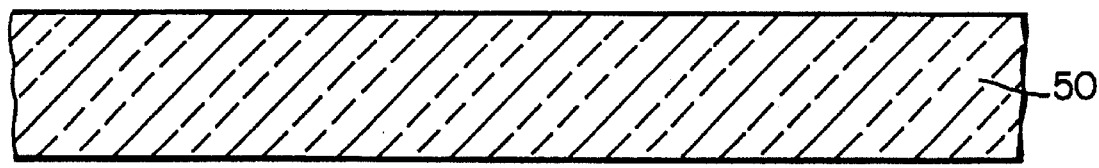
FIG. 17 is a cross-sectional elevational view of an insulator as used in a further embodiment of the subject invention.

A further embodiment of the subject invention is shown in FIGS. 17–24, in which tungsten studs are formed simultaneously with the interconnect line. As shown in FIG. 17, an insulator layer 50 is provided. As with the first and second embodiments, this insulator layer 50 would overlie a semiconductor structure and will serve as the location for an interconnect line.

Figure 18:
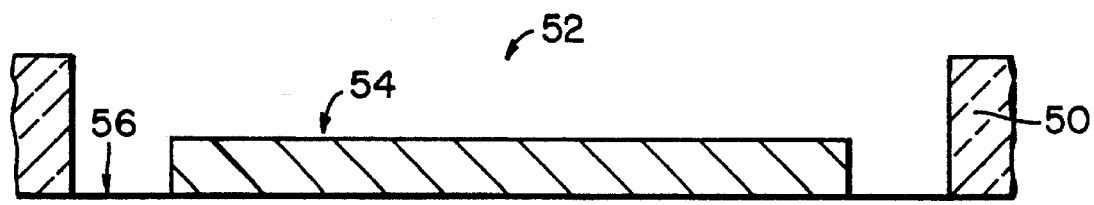
FIG. 18 is a cross-sectional elevational view of the insulator shown in FIG. 17 with a trench etched therein.

In accordance with this construction, a trench 52 is etched into the insulator layer 50 as shown in FIG. 18. The trench 52 is etched to two different levels, so that the interconnect line can be formed on the trench bottom 54 at the first depth and the via 56 will provide the contact to an underlying layer at the second depth by way of a tungsten stud.

Figure 19:
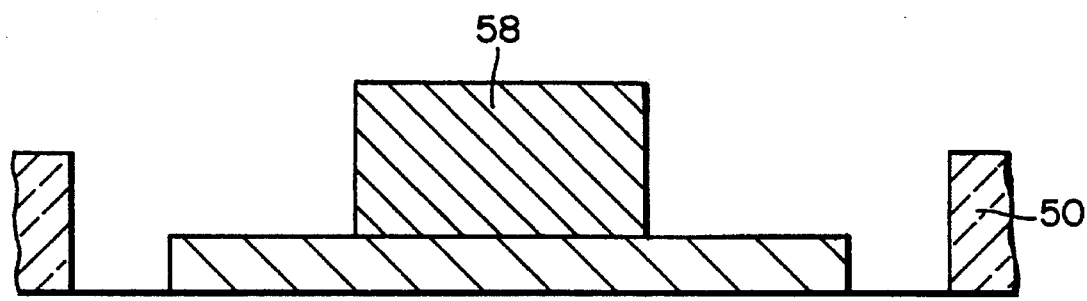
FIG. 19 is a cross-sectional elevational view of the structure shown in FIG. 18 with a pattern of resist thereon.

In accordance with the subject invention, a pattern of resist 58 is deposited on the insulator layer 50 and within the trench, as shown in FIG. 19. Each section of the resist extends a distance of about 20–50 microns, and the via 56 is not covered by the pattern of resist 58.

Figure 20:
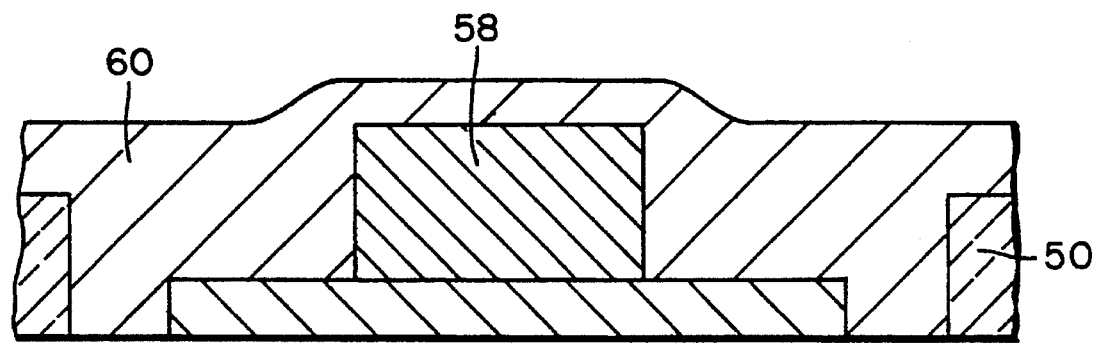
FIG. 20 is a cross-sectional elevational view of the structure shown in FIG. 19 with a diffusion barrier material deposited thereover.
Figure 21:
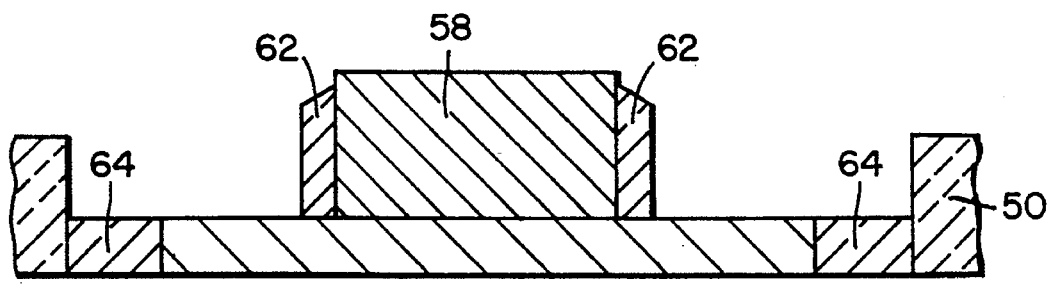
FIG. 21 is a cross-sectional elevational view of the structure shown in FIG. 20 after etching to remove a portion of the diffusion barrier material.
Figure 22:
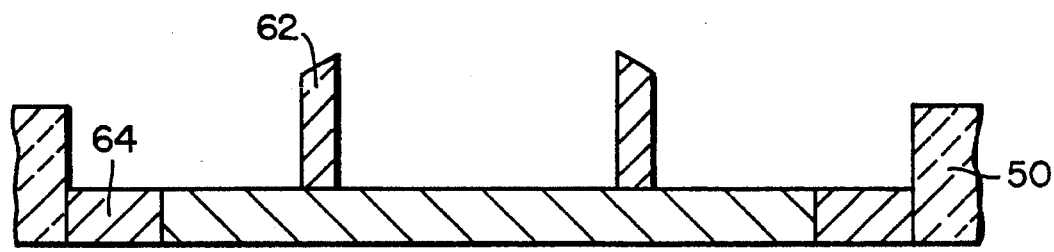
FIG. 22 is a cross-sectional elevational view of the structure shown in FIG. 21 after removal of the resist.

A diffusion barrier layer 60 of tungsten is deposited over the entire structure (see FIG. 20). A suitable etch is then utilized to remove the diffusion barrier layer 60 so that the sidewall spacers which will form the diffusion barriers 62 and the tungsten stud 64 remain (see FIG. 21). The resist 58 is then removed by suitable means to leave the isolated, periodic transverse diffusion barriers 62 within the trench in the insulator layer (see FIG. 22) as well as the tungsten studs 64. The distance between the diffusion barriers is thus about 20–50 microns.

Figure 23:
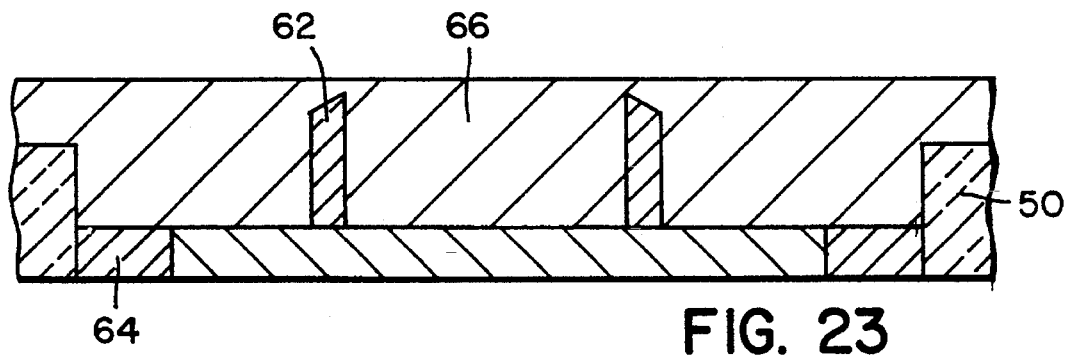
FIG. 23 is a cross-sectional elevational view of the structure shown in FIG. 22 with a layer of interconnect line metal deposited thereover.
Figure 24:
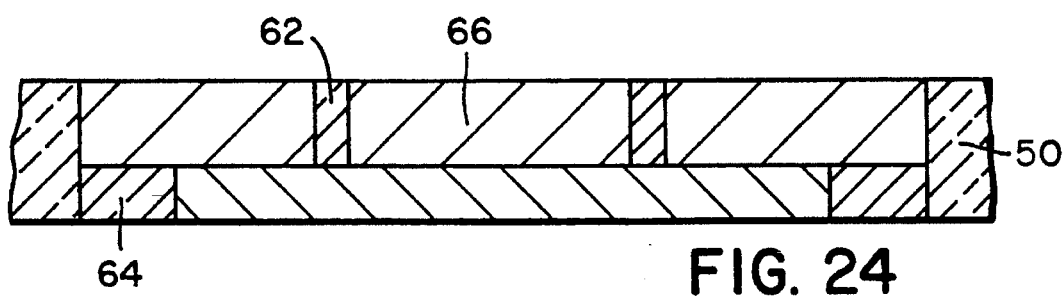
FIG. 24 is a cross-sectional elevational view of the structure shown in FIG. 23 after polishing to form the interconnect line with isolated, periodic spaced diffusion barriers therein and simultaneously formed studs.

Referring to FIG. 23, the metallization layer 66 is then deposited over the entire structure, covering the diffusion barriers 62 and the diffusion barrier (i.e. tungsten) studs 64 and filling the remainder of the trench. Suitable planarization techniques, such as chemical mechanical polishing, are then utilized to planarize the surface of the interconnect line and the diffusion barriers with the surface of the insulator layer, as shown in FIG. 24. The resulting interconnect line comprises the metallization layer 66 with isolated, periodic transverse diffusion barriers 62 within the same plane as the metallization layer 66, and with simultaneously formed tungsten studs 64 for contact with the layer underlying the insulator layer 50. Each section of metallization extends for about 20–50 microns, and is separated from the next adjacent section by the diffusion barrier which extends for about 0.4–0.8 microns. This structure of the interconnect line provides for reduced electromigration and metal creep.

Figure 25:
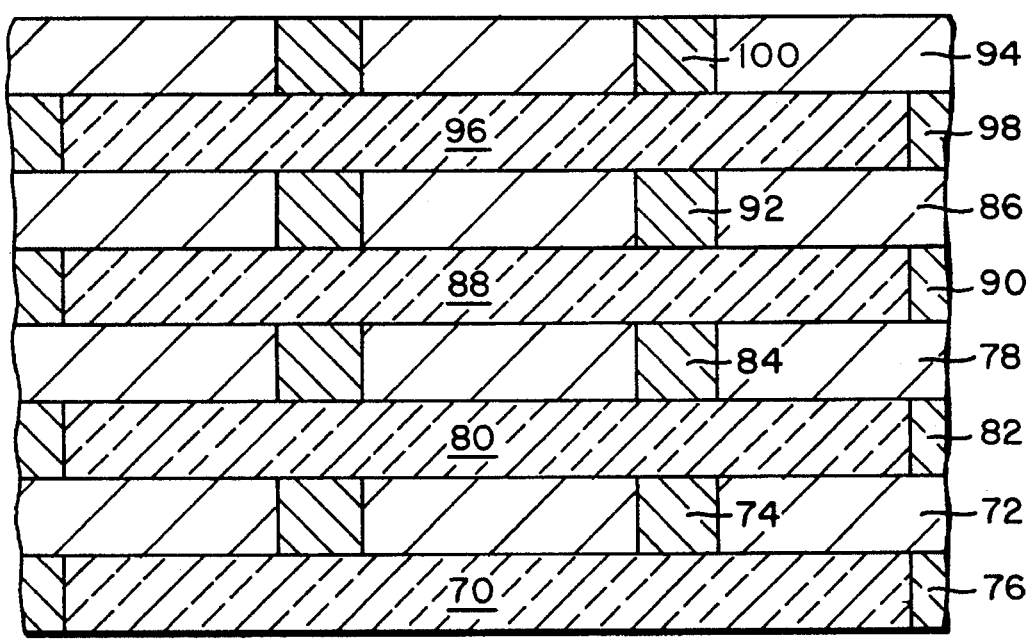
FIG. 25 is a cross-sectional elevational view of multiple interconnect lines having a structure according to the subject invention.

As discussed above, interconnect lines having the above construction are often present in multiple layers. Referring to FIG. 25, a first interconnect line 72 is shown having diffusion barriers 74 therein. The interconnect line 72 is formed in insulator layer 70 and connects to a layer underlying the insulator layer 70 through stud 76. A second interconnect line 78 having diffusion barriers 84 therein is formed in insulator layer 80 and connects to interconnect line 72 through stud 82. A third interconnect line 86 having diffusion barriers 92 therein is formed in insulator layer 88 and connects to interconnect line 78 through stud 90. A fourth interconnect line 94 having diffusion barriers 100 therein is formed in insulator layer 96 and connects to interconnect line 86 through stud 98. Multi-level interconnect structures with reduced electromigration and metal creep are thus provided according to the subject invention. The length of each level of the line can be much longer than previously practical due to the transverse diffusion barriers within each level of line.

In each of the above-described embodiments, suitable materials and methods can be utilized as known to those skilled in the art. Suitable insulator materials include, but are not limited to, oxides such as silicon dioxide. Suitable metallization layer materials include, for example, aluminum, copper, aluminum/copper alloys, and other aluminum alloys and copper alloys. Suitable diffusion barrier materials as used herein are those materials with a high tensile modulus and yield strength, and a low diffusivity of the metallization layer material. The diffusion barrier material must also be capable of withstanding stress caused by electromigration of atoms within the metallization layer. Preferably, the diffusion barrier materials comprise low conductivity metals, such as tungsten, molybdenum, and tantalum. These metals have low resistivity (and therefore do not appreciably increase the resistivity of the line) and have a low diffusivity of aluminum, copper, aluminum/copper alloys, and other aluminum alloys and copper alloys. They have the high tensile modulus and yield strength necessary to function as a stress barrier. Since an element in the reduction of electromigration is the back diffusion of material caused by the stress gradient at the interconnect, the insulator materials must also be able to withstand this stress gradient without significant deformation. Similarly, the diffusion barrier material must also have sufficient thickness and mechanical strength to prevent rupture or appreciable deformation by the stress gradient (caused by the electromigration of atoms within the metallization layer). Suitable pattern materials include, for example, high temperature resists and polymers such as polyimide which are compatible with the processing conditions needed for deposition of the diffusion barrier material.

The diffusion barriers are formed within the interconnect lines in a transverse orientation, i.e. they are positioned in a direction perpendicular to the direction of electromigration of atoms within the interconnect line. The diffusion barriers thus prevent or reduce electromigration within the line. The sections of metallization material within the lines extend only to about 20–50 microns, and are separated by the diffusion barriers of 0.4–0.8 microns in width. This optimizes the reduction of electromigration within the line by optimizing both concentration and pressure gradients within the line.

Suitable methods for utilization in the subject invention should be readily apparent to those skilled in the art. A trench can be etched in the insulator material utilizing reactive ion etching, and patterned resist can be formed by suitable photolithographic methods. The diffusion barrier material can be formed by chemical vapor deposition (CVD) or sputtering, for example. The technique utilized must be capable of filling the small spaces between the sections of resist or polymer, and therefore CVD or plating are preferred. The diffusion barrier material can then be etched by isotropic or anisotropic reactive ion etching, depending upon the particular embodiment. Anisotropic etching is necessary where vertical sidewall spacers need to be formed. The metallization material for the line itself is formed by suitable means such as CVD, ECR, plating, or sputtering. Once formed, the line with the transverse diffusion barriers therein is planarized using suitable techniques. Chemical mechanical polishing is preferred.

While the invention has been particularly shown and described with reference to preferred embodiments thereof, it will be understood by those skilled in the art that various changes in form and details may be made therein without departing from the spirit and scope of the invention.

We claim:

1. A method of forming an interconnect line in an insulator layer of a semiconductor structure, said method comprising:

forming an insulator layer;

forming a trench in said insulator layer, said trench having a first depth within said insulator layer for an interconnect line and a second depth through said insulator layer for contact of said interconnect line to a layer underlying said insulator layer;

forming a pattern of sections of material transversely and spaced apart within said trench;

forming a layer of diffusion barrier material over said pattern and within said trench;

removing a portion of said diffusion barrier material so as to form a plurality of transverse spaced apart vertical sections of diffusion barrier material within said trench;

removing said pattern of material, so as to leave a plurality of transverse diffusion barriers spaced apart within said trench; and forming a layer of metallization within remaining portions of said trench, said metallization and said plurality of transverse diffusion barriers thereby forming an interconnect line within said insulator layer wherein said interconnect line has a plurality of transverse diffusion barriers spaced apart therein.

2. The method of claim 1 wherein said sections of said pattern are spaced apart in the range of 20–50 microns.

3. The method of claim 1 wherein said sections of said pattern are spaced apart in the range of 0.4 to 0.8 microns.

4. The method of claim 1 wherein one of said plurality of transverse diffusion barriers overlies said trench at said second depth and comprises a stud for connecting said interconnect line to a layer underlying said insulator layer.

5. The method of claim 1 further comprising planarizing said interconnect line and said plurality of transverse diffusion barriers to a level of said insulator layer.

* * * * *